(12) United States Patent
Slade et al.

(10) Patent No.: US 7,646,200 B2
(45) Date of Patent: Jan. 12, 2010

(54) DNP APPARATUS

(75) Inventors: Robert Andrew Slade, Cassington (GB); Martin Charles Townsend, Cumnor (GB); Daniel Strange, Wantage (GB); Gary Stables, Abingdon (GB); Walter Friedrich Kockenberger, Nottingham (GB)

(73) Assignees: Oxford Instruments Molecular Biotools Limited, Abingdon, Oxon (GB); University of Nottingham, Nottingham (GB)

( * ) Notice: Subject to any disclaimer, the term of this patent is extended or adjusted under 35 U.S.C. 154(b) by 0 days.

(21) Appl. No.: 12/194,283

(22) Filed: Aug. 19, 2008

(65) Prior Publication Data
US 2009/0051361 A1 Feb. 26, 2009

(30) Foreign Application Priority Data
Aug. 24, 2007 (EP) .................................. 07114986

(51) Int. Cl.
*G01V 3/00* (2006.01)
(52) U.S. Cl. ........................................ 324/321; 324/318
(58) Field of Classification Search ......... 324/300–322; 600/407–445, 485, 561; 219/385; 62/51.1; 422/99
See application file for complete search history.

(56) References Cited

U.S. PATENT DOCUMENTS

| | | | |
|---|---|---|---|
| 6,396,274 B1 * | 5/2002 | Commens et al. | 324/321 |
| 6,515,260 B1 * | 2/2003 | Anderson | 219/385 |
| 6,682,492 B1 * | 1/2004 | Joensuu | 600/561 |
| 2007/0038076 A1 * | 2/2007 | Osada et al. | 600/420 |
| 2008/0104966 A1 * | 5/2008 | Stautner | 62/6 |
| 2008/0240998 A1 * | 10/2008 | Urbahn et al. | 422/99 |
| 2008/0290869 A1 * | 11/2008 | Hutton et al. | 324/318 |
| 2009/0007572 A1 * | 1/2009 | Bell | 62/3.7 |
| 2009/0007573 A1 * | 1/2009 | Noonan et al. | 62/51.1 |
| 2009/0085562 A1 * | 4/2009 | Strange et al. | 324/307 |

FOREIGN PATENT DOCUMENTS

| | | |
|---|---|---|
| WO | WO-02/37132 | 5/2002 |
| WO | WO-05/114244 | 12/2005 |

* cited by examiner

*Primary Examiner*—Brij B Shrivastav
(74) *Attorney, Agent, or Firm*—Blank Rome LLP

(57) ABSTRACT

A coolant sub-assembly is provided for use in a DNP apparatus. The sub-assembly comprises a plurality of concentric jackets surrounding an inner bore tube having first and second opposed ends. The jackets are adapted to inhibit heat flow to the inner bore tube, a DNP working region being defined within the inner bore tube where a DNP process will be performed on a sample in the DNP working region. A coolant supply path extends adjacent an outer surface of the inner bore tube at the DNP working region in order to cool said outer surface, whereby a sample holder assembly can be inserted through the first end of the inner bore tube to bring a sample holder into the DNP working region and can be moved through the second end of the inner bore tube. An auxiliary coolant supply path supplies coolant to a sample, located in use in the sample holder at the DNP working region, through at least one aperture in the inner bore tube wall at the DNP working region. One or both ends of the inner bore tube opens into a coolant waste path for conveying coolant away from the inner bore tube, and wherein the coolant, auxiliary coolant, and waste paths are coupled to pumping means in use to cause coolant to pass along the coolant, auxiliary coolant and waste paths.

17 Claims, 3 Drawing Sheets

DNP APPARATUS

CROSS-REFERENCE TO RELATED APPLICATIONS

This application claims the benefit under 35 U.S.C. § 119 of European Patent Application No. 07114986.8, filed on Aug. 24, 2007, in the European Patent Office (EPO), the disclosure of which is incorporated herein by reference in its entirety.

FIELD OF THE INVENTION

The invention relates to DNP (dynamic nuclear polarization) apparatus.

DESCRIPTION OF THE PRIOR ART

In the field of nuclear magnetic resonance (NMR) analysis, it is necessary to detect nuclear spins of materials of interest. Conventional magnetic resonance imaging (MRI) and NMR spectroscopy often lack sensitivity due to the very low polarizations of the nuclear spins of the materials used. To reduce this problem, it has become common to enhance the polarization by using a variety of techniques, one of which is dynamic nuclear polarization (DNP). In DNP, a sample is placed in a high strength magnetic field and held at low temperature while being irradiated with microwaves. The hyper polarized sample is then rapidly removed from the DNP apparatus and placed in an NMR apparatus for subsequent inspection. Examples of known systems can be found in WO-A-02/37132 and WO-A-2005/1 14244.

A problem with these known systems is that, although the sample will retain polarization of carbon because the hyper polarization of carbon relaxes slowly in liquid, polarization of protons is not retained since this relaxes very fast. This is a drawback because most high resolution NMR is carried out on protons.

SUMMARY OF THE INVENTION

In accordance with the present invention a coolant sub-assembly for use in a DNP apparatus comprises:

a plurality of concentric jackets surrounding an inner bore tube having first and second opposed ends, the jackets being adapted to inhibit heat flow to the inner bore tube, a DNP working region being defined within the inner bore tube where a DNP process will be performed on a sample in the DNP working region, whereby a sample holder assembly can be inserted through the first end of the inner bore tube to bring a sample holder into the DNP working region and can be moved through the second end of the inner bore tube;

a coolant supply path extending adjacent an outer surface of the inner bore tube at the DNP working region in order to cool said outer surface; and an auxiliary coolant supply path for supplying coolant to a sample, located in use in the sample holder at the DNP working region, through at least one aperture in the inner bore tube wall at the DNP working region;

wherein one or both ends of the inner bore tube opens into a coolant waste path for conveying coolant away from the inner bore tube, and wherein the coolant, auxiliary coolant, and waste paths are coupled to pumping means in use to cause coolant to pass along the coolant, auxiliary coolant and waste paths.

We have devised a new form of coolant sub-assembly which can cool a sample within a DNP working region by flowing coolant past the sample while the subassembly is constructed such that a sample holder assembly can be withdrawn through the second end of the inner bore tube opposite to the first end into which it was inserted. This means that the hyper polarized sample can be rapidly transferred from the DNP working region into an NMR working region if the coolant sub-assembly is mounted coaxially with the NMR apparatus.

In some examples, the coolant waste path opens into said first end of the inner bore tube while, in other examples, it opens into said second end of the inner bore tube. In a third example, the coolant waste path can open into both ends of the inner bore tube.

It is important to be able to control the flow of coolant to the sample. If the flow is too low, cooling will be insufficient. If the flow is too high, drops of coolant may form and, when the sub-assembly is vertically arranged, could cool a lower end of the inner bore tube, which is undesirable because, when it is connected to a bore of NMR apparatus, this should be at or around room temperature.

Preferably, therefore, the auxiliary coolant supply path is defined by one or more capillaries extending from the coolant supply path the corresponding at least one aperture in the inner bore tube wall. This structure enables the coolant flow to be accurately determined, and further control can be achieved by providing a heater coupled to one or more of the capillaries.

A further problem which can arise when the coolant sub-assembly is mounted on an NMR apparatus is that heat may pass up through the inner bore tube due to convection and radiation since the NMR apparatus bore will be at room temperature. At the same time, however, it must be possible to withdraw the sample holder through the second end of the inner bore tube. To deal with this, the sub-assembly preferably further comprises one or more resilient baffles extending across the inner bore tube, between the first and the second end of the inner bore tube apertures, for reducing heat radiation and being sufficiently flexible to allow movement of a sample holder past the or each baffle. The baffles should be made of a suitable reflective material such as mylar.

The arrangement of concentric jackets can be chosen depending upon each application. Typically, the arrangement will include at least one radiation shield and an evacuated region and/or coolant containing region. The choice will depend upon the temperature at which the inner bore tube is to be maintained as well as whether a suitable coolant is available, etc.

BRIEF DESCRIPTION OF THE DRAWINGS

Some examples of coolant sub-assemblies according to the present invention will now be described with reference to the accompanying drawings, in which.

DETAILED DESCRIPTION OF THE EMBODIMENTS

Figure 1:
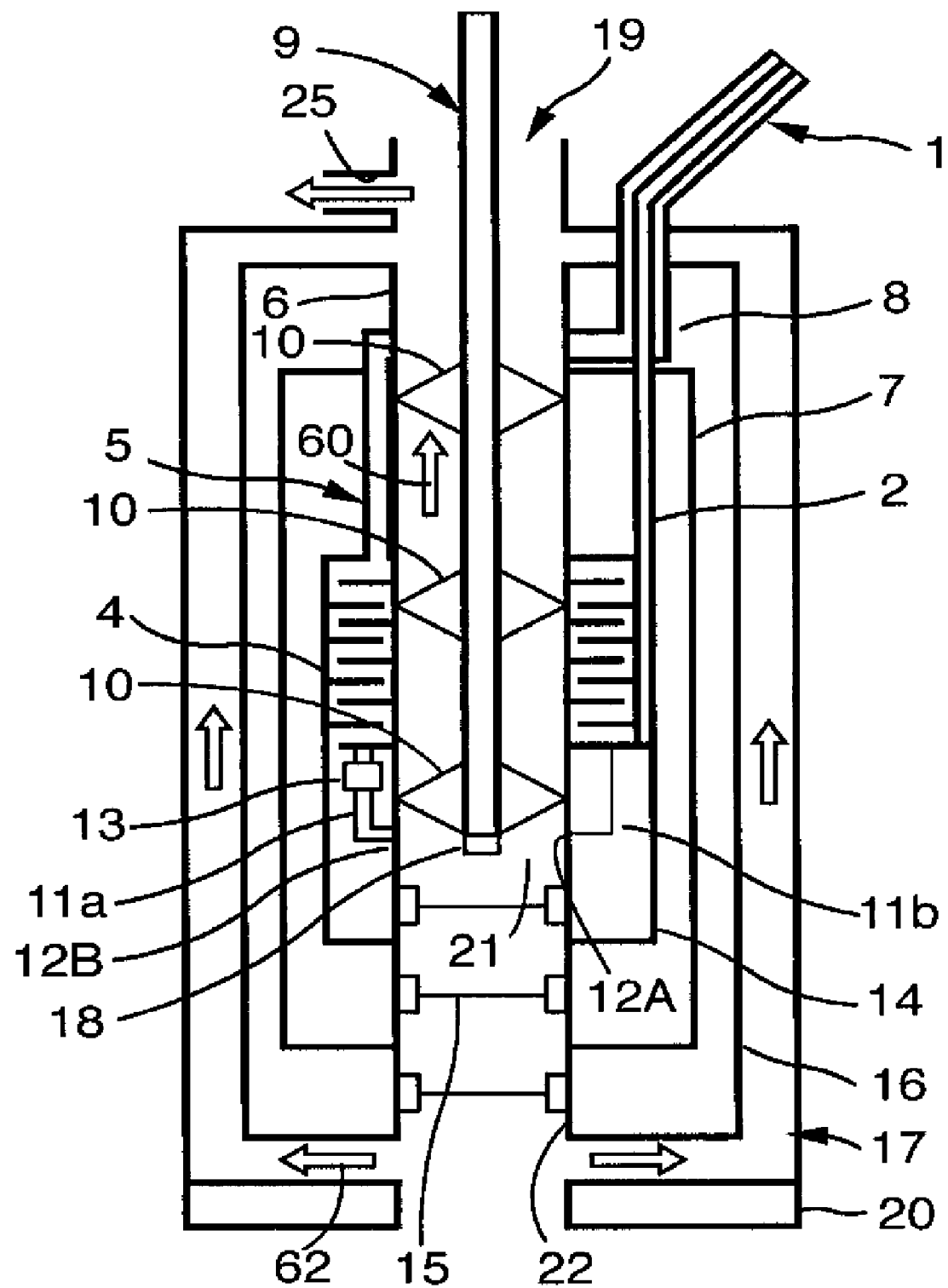
FIG. 1 is a schematic longitudinal section through an example of a coolant sub-assembly.

The coolant sub-assembly (or cryo-insert) shown in FIG. 1 comprises an inner bore tube 6 surrounded by a plurality of concentric jackets including inner and outer radiation shields 14 and 7, an outer vacuum chamber wall 16, and an outer sock 17. In some cases, only one radiation shield may be needed. The inner bore tube 6 is vertically oriented and has an upper, first opening closed by a seal 19 through which a sample insertion rod 9 can be removably inserted. The rod 9 has a sample holder 18 removably mounted at its lower end, the sample holder being shown in FIG. 1 located at a DNP working region indicated by a shaded area 21. The spaces between the inner bore tube 6 and the radiation shield 7 and between the radiation shields 7 and 16 are evacuated.

Figure 2:
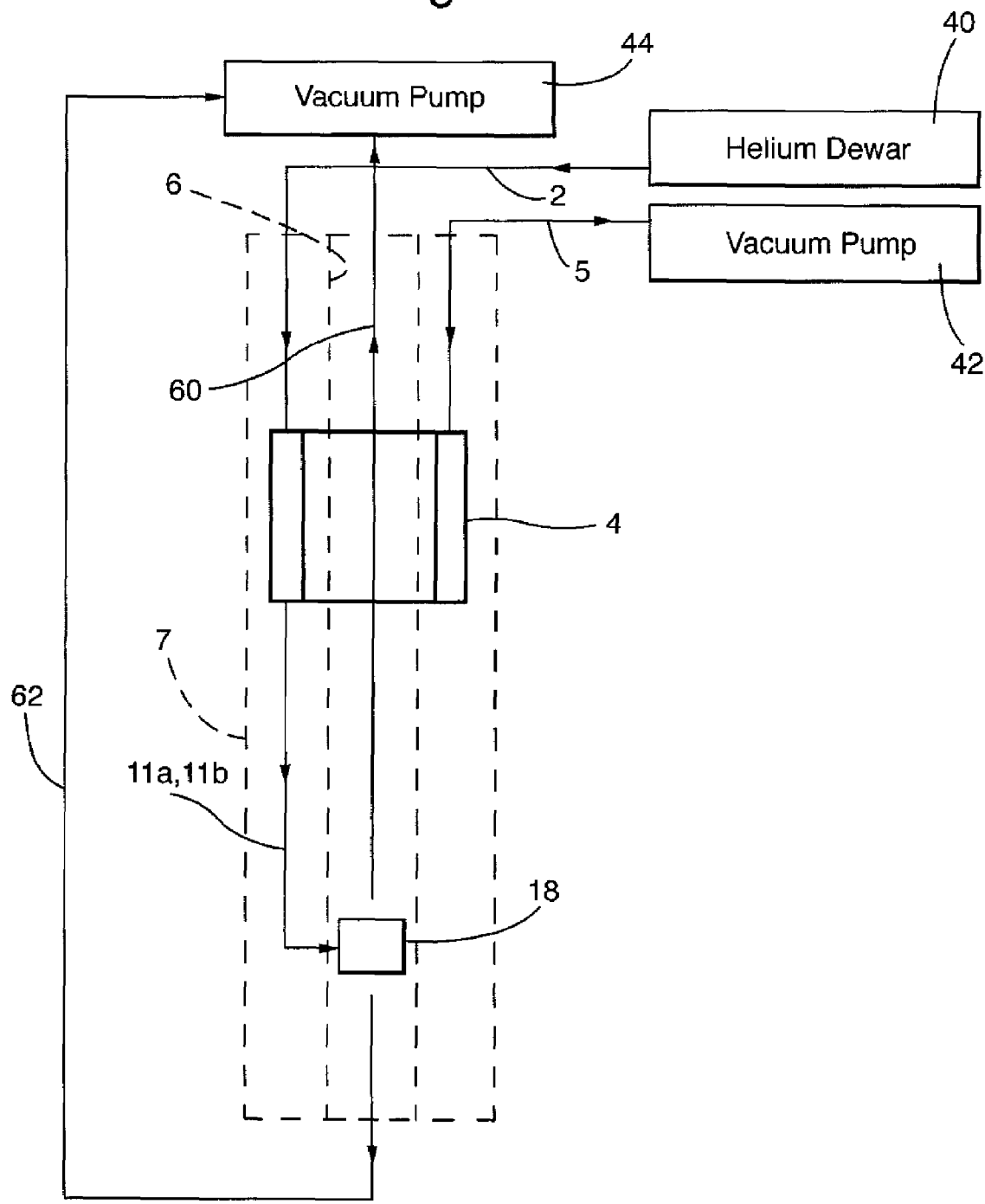
FIG. 2 illustrates the coolant paths of the FIG. 1 example.

A primary liquid helium coolant supply path is used to provide primary cooling to the inner bore tube 6. This supply path comprises a capillary 2 connected at its upper end to a storage dewar 40 (FIG. 2) via a siphon 1, wherein the capillary 2 extends through the evacuated space defined between the inner bore tube 6 and radiation shield 7 to a heat exchanger 4. At the heat exchanger 4, expansion and cooling occur at about 3-4K. The gaseous helium then flows back through a tube section 5 thermally coupled to a radiation shield 7 so as to cool this outer radiation shield and finally back to a siphon jacket 8 surrounding the capillary 2 where it cools the incoming helium in the capillary 2. The main flow of liquid helium through this coolant path is promoted by a small vacuum pump 42 at the supply dewar. The sample insertion rod 9 is cooled via conduction through the bore and hence to the main liquid helium flow path using spring fingers 10 which also guide and centralize the rod within the inner bore tube 6.

In order to cool a sample within the sample holder 18, an auxiliary coolant flow path is provided in which a small proportion of the liquid helium from the heat exchanger 4 is diverted to flow via one or more long capillaries 11a and 11b and, having undergone a pseudo-isenthalpic expansion, is bled into the main bore of the inner bore tube 6 via corresponding first apertures 12A and 12B to spray onto the sample and form a supercooled film.

The impedance of the two capillaries (the capillary 11a having a larger bore than the capillary 11b) can be varied by applying current to one or more small heaters 13 wrapped around the capillaries. The heater 13 is shown wrapped around the capillary 11a in FIG. 1, but it could be provided around the capillary 11b, or, indeed, both capillaries 11a and 11b could have respective heaters.

The main bore is evacuated through a first coolant waste path 60 via a high capacity vacuum pump 44. This high capacity vacuum pump 44 is connected to an opening 26 at the upper end of the inner bore tube 6.

In this example, a further coolant waste path 62 is provided exiting through the second, lower end 22 of the inner bore tube 6 and passing up between the outer vacuum chamber wall 16 and the outer sock 17 into the upper end of the inner bore tube 6 and then out through the opening 26.

If the cryo-insert is mounted on top of an NMR system with the bores in alignment, then the temperature at the lower end of the inner bore tube will be substantially room temperature. It is therefore important to control, to a minimum, radiation (and convection) of heat in the lower half of the inner bore tube 6, which is achieved in this example by the insertion of several reflective aluminized mylar film baffles 15. These baffles 15 also block direct radiation from the lower end of the bore. The baffles are slit (not shown) with cross-cuts that are adapted not to impede vapor flow and also to allow the rod 9 to pass easily therethrough when the sample is moved down towards the NMR apparatus.

Although liquid Helium is used as the coolant in this example, other coolants, such as liquid nitrogen, could also be used, particularly for cooling the cryostat jackets.

Figure 3:
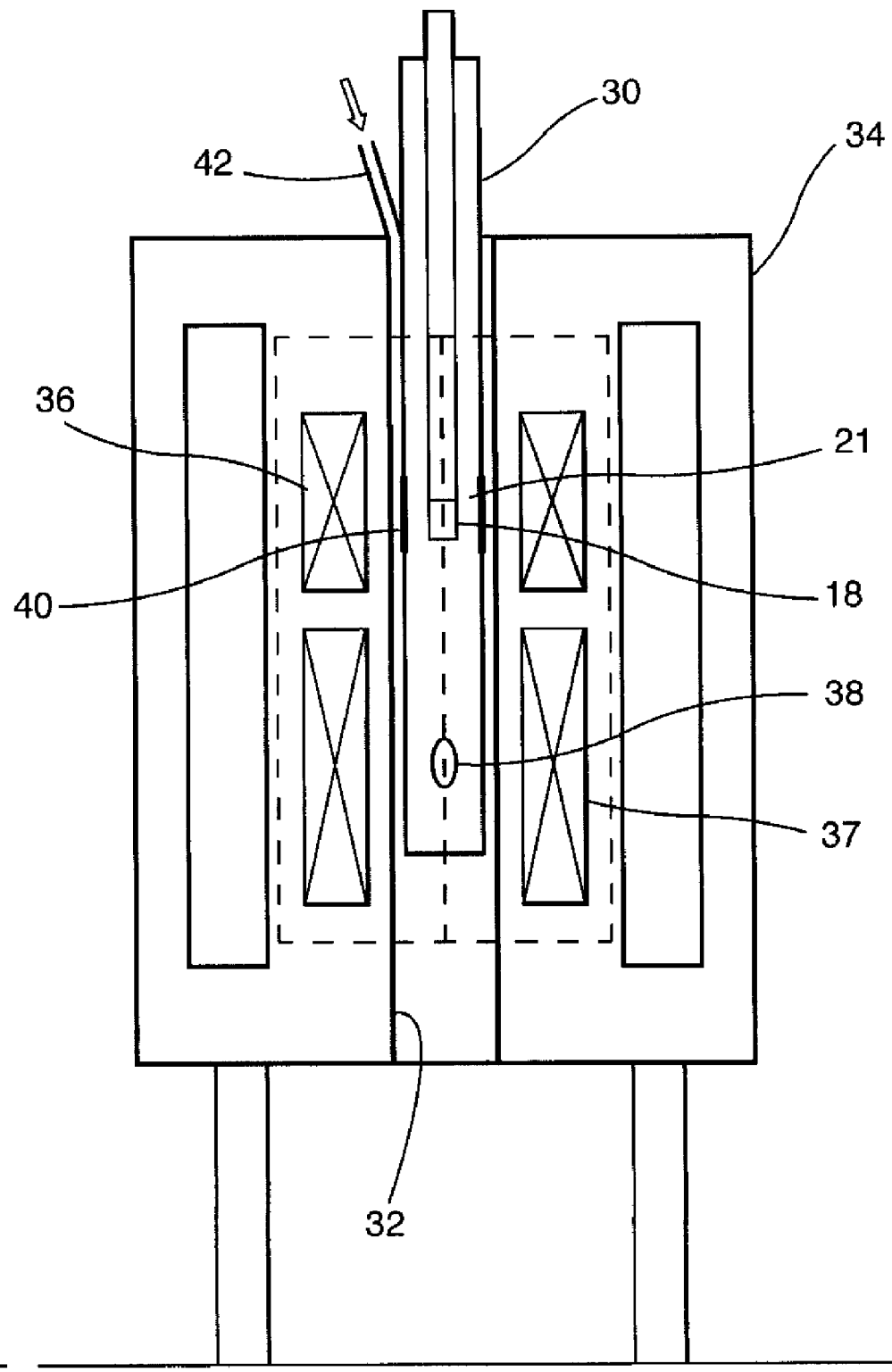
FIG. 3 illustrates a combined DNP and NMR apparatus incorporating a coolant sub-assembly according to the invention.

FIG. 3 illustrates schematically the cryo-insert 30 of FIG. 1 located in a room temperature bore 32 of a cryostat 34. DNP and NMR magnets 36 and 37 are located coaxially in the cryostat 34 so that they can be operated under superconducting conditions to generate high field strengths in the DNP working region 21 and an NMR working region 38, respectively. FIG. 3 also illustrates the microwave cavity 40 at the DNP working region 21 and microwave feed 42.

In operation, a sample is placed in the sample holder 18, which is then mounted on the end of the sample holding rod 9, and the rod 9 is inserted into the inner bore tube 6 through the seal 19. The sample holder 18 is then brought into the DNP working region 21. The flow of liquid helium through the auxiliary coolant path causes liquid to begin to flow over the sample and to cool it to a very low temperature. At that stage, the sample, which is located in the cavity 40, is irradiated with microwaves to achieve hyper polarization.

The sample holding rod 9 is then pushed further down through the bore tube 6 so that the sample holder passes through the film baffles 15 to a dissolution position 20. At this position, solvent is supplied to the sample holder 18, either through the sample holding rod 9 or by some other means, to dissolve the sample. In other examples, the hyper polarized sample is melted, for example, by means of a heater or laser or other known method. After the sample has been dissolved (or melted), the sample holding rod 9 is pushed further down to transfer the sample into the NMR working region 38 where the NMR process can be carried out.

In a first alternative embodiment (not shown), all waste helium passes up through the inner bore tube 6 and out to the vacuum pump through opening 26. In a further alternative embodiment, all waste liquid helium is extracted through the lower end 22 of the inner bore tube 6 using a vacuum pump.

There are also options for delivery of solvent to the hyper polarized sample, namely down through the sample holding rod 9 or up into the sample holder through the lower end of the inner bore tube 6.

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

What is claimed is:

1. A sample processing apparatus comprising one or more magnets defining a bore with spaced apart DNP and NMR working regions and within which are generated magnetic fields suitable for DNP and NMR respectively; and a coolant sub-assembly located in the bore, the coolant sub-assembly comprising:

a plurality of concentric jackets surrounding an inner bore tube having first and second opposed ends, the jackets being adapted to inhibit heat flow to the inner bore tube, a DNP working region being defined within the inner bore tube where a DNP process will be performed on a sample in the DNP working region, whereby a sample holder assembly can be inserted through the first end of the inner bore tube to bring a sample holder into the DNP working region and can be moved through the second end of the inner bore tube;

a coolant supply path extending adjacent an outer surface of the inner bore tube at the DNP working region in order to cool said outer surface; and an auxiliary coolant supply path for supplying coolant to a sample, located in use in the sample holder at the DNP working region, through at least one in the inner bore tube wall at the DNP working region, wherein one or both ends of the inner bore tube opens into a coolant waste path for conveying coolant away from the inner bore tube, and wherein the coolant, auxiliary coolant, and waste paths are coupled to pumping means in use to cause coolant to pass along the coolant, auxiliary coolant and waste paths, the arrangement being such that a sample holder can be moved from the DNP working region through said second end of the inner bore tube, and a solvent supply system to enable, preferably hot, solvent to be supplied into the sample holder, or means for melting the sample.

2. The processing apparatus according to claim 1, wherein the magnet(s) are located in a cryostat.

3. The processing apparatus according to claim 1, wherein two magnets are provided, one located about the DNP working region and the other about the NMR working region.

4. The processing apparatus according to claim 1, further comprising a liquid helium reservoir connected to the coolant supply path.

5. The processing apparatus according to claim 1, wherein the bore is arranged vertically with the DNP working region above the NMR working region.

6. A coolant sub-assembly for use in a DNP apparatus, the coolant sub-assembly comprising:

a plurality of concentric jackets surrounding an inner bore tube having first and second opposed ends, the jackets being adapted to inhibit heat flow to the inner bore tube, a DNP working region being defined within the inner bore tube where a DNP process will be performed on a sample in the DNP working region, whereby a sample holder assembly can be inserted through the first end of the inner bore tube to bring a sample holder into the DNP working region and can be moved through the second end of the inner bore tube;

a coolant supply path extending adjacent an outer surface of the inner bore tube at the DNP working region in order to cool said outer surface; and an auxiliary coolant supply path for supplying coolant to a sample, located in use in the sample holder at the DNP working region, through at least one aperture in the inner bore tube wall at the DNP working region;

wherein one or both ends of the inner bore tube opens into a coolant waste path for conveying coolant away from the inner bore tube, and wherein the coolant, auxiliary coolant, and waste paths are coupled to pumping means in use to cause coolant to pass along the coolant, auxiliary coolant, and waste paths.

7. A coolant sub-assembly according to claim 6, wherein the waste path is defined partly by the region between two of the plurality of concentric jackets that are adjacent.

8. A coolant sub-assembly according to claim 6, wherein the auxiliary coolant supply path is connected in parallel to the coolant supply path.

9. A coolant sub-assembly according to claim 6, wherein the auxiliary coolant supply path is defined by one or more capillaries extending from the coolant supply path to the corresponding at least one aperture in the inner bore tube wall.

10. A coolant sub-assembly according to claim 9, wherein at least one capillary has a wider diameter than at least one other capillary.

11. A coolant sub-assembly according to claim 6, further comprising a heater coupled to one or more of the capillaries to control coolant flow therethrough.

12. A coolant sub-assembly according to claim 6, further comprising a heat exchanger in the coolant supply path contacting the outer surface of the inner bore tube at the DNP working region.

13. A coolant sub-assembly according to claim 6, further comprising one or more resilient baffles extending across the inner bore tube, between the at least one aperture and the second end of the inner bore tube, for reducing heat radiation and being flexible to allow movement of a sample holder past the or each baffle.

14. A coolant sub-assembly according to claim 13, wherein the or each baffle is formed by a plurality of flexible leaves.

15. A coolant sub-assembly according to claim 13, wherein the or each baffle is made of a reflective material such as mylar.

16. A coolant sub-assembly according to claim 6, wherein the jackets include an evacuated jacket.

17. A coolant sub-assembly according to claim 6, further comprising a sample holder assembly including a sample holder mounted on the end of an elongate member.

* * * * *